(12) United States Patent
Harrison

(10) Patent No.: US 6,608,316 B1
(45) Date of Patent: Aug. 19, 2003

(54) ION IMPLANTATION BEAM MONITOR

(75) Inventor: Bernard Francis Harrison, Copthorne (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/720,777

(22) PCT Filed: Jul. 1, 1999

(86) PCT No.: PCT/GB99/02087

§ 371 (c)(1), (2), (4) Date: Apr. 2, 2001

(87) PCT Pub. No.: WO00/02229

PCT Pub. Date: Jan. 13, 2000

(51) Int. Cl.$^7$ ............................................. H01J 37/317
(52) U.S. Cl. .............. 250/492.21; 250/398; 250/396 R; 315/111.1; 315/506
(58) Field of Search ............................ 250/492.21, 398, 250/396 R; 315/111.1, 506

(56) References Cited

U.S. PATENT DOCUMENTS 4,980,562 A * 12/1990 Berrian et al. ............ 250/492.2
5,641,969 A     6/1997 Cooke et al.
5,747,936 A * 5/1998 Harrison et al. ......... 315/111.81
6,313,474 B1 * 11/2001 Iwasawa et al. ........ 250/492.21

FOREIGN PATENT DOCUMENTS

GB    2307592     5/1997
JP    10134760    5/1998

OTHER PUBLICATIONS

Harrison, B., et al., "Resistive Deceleration in the xRLEAP Implanter", Ion Implantation Technology Proceedings of the International Conference on Ion Implantation Technology, Jan. 1, 1997, pp. 319–322.

* cited by examiner

*Primary Examiner*—John R. Lee
*Assistant Examiner*—Zia R. Hashmi
(74) *Attorney, Agent, or Firm*—Boult Wade Tennant

(57) ABSTRACT

An ion implanter, the total return current between the substrate holder and flight tube is measured. Measuring the total current returned to the flight tube provides a useful indication of the total ion current in the ion beam leaving the flight tube as well as any electrons travelling back to, and being absorbed by, the flight tube. This in turn permits the quality of the ion beam post mass selection to be monitored, continuously if desired. The total current returned to the flight tube can be compared with the current measured by the beam, the latter varying rapidly with time as the beam stop is periodically occluded by the rotating substrate wheel.

In order to general a potential difference between the substrate holder and the flight tube, either a power supply or an active resistance such as an FET chain can be employed.

25 Claims, 7 Drawing Sheets

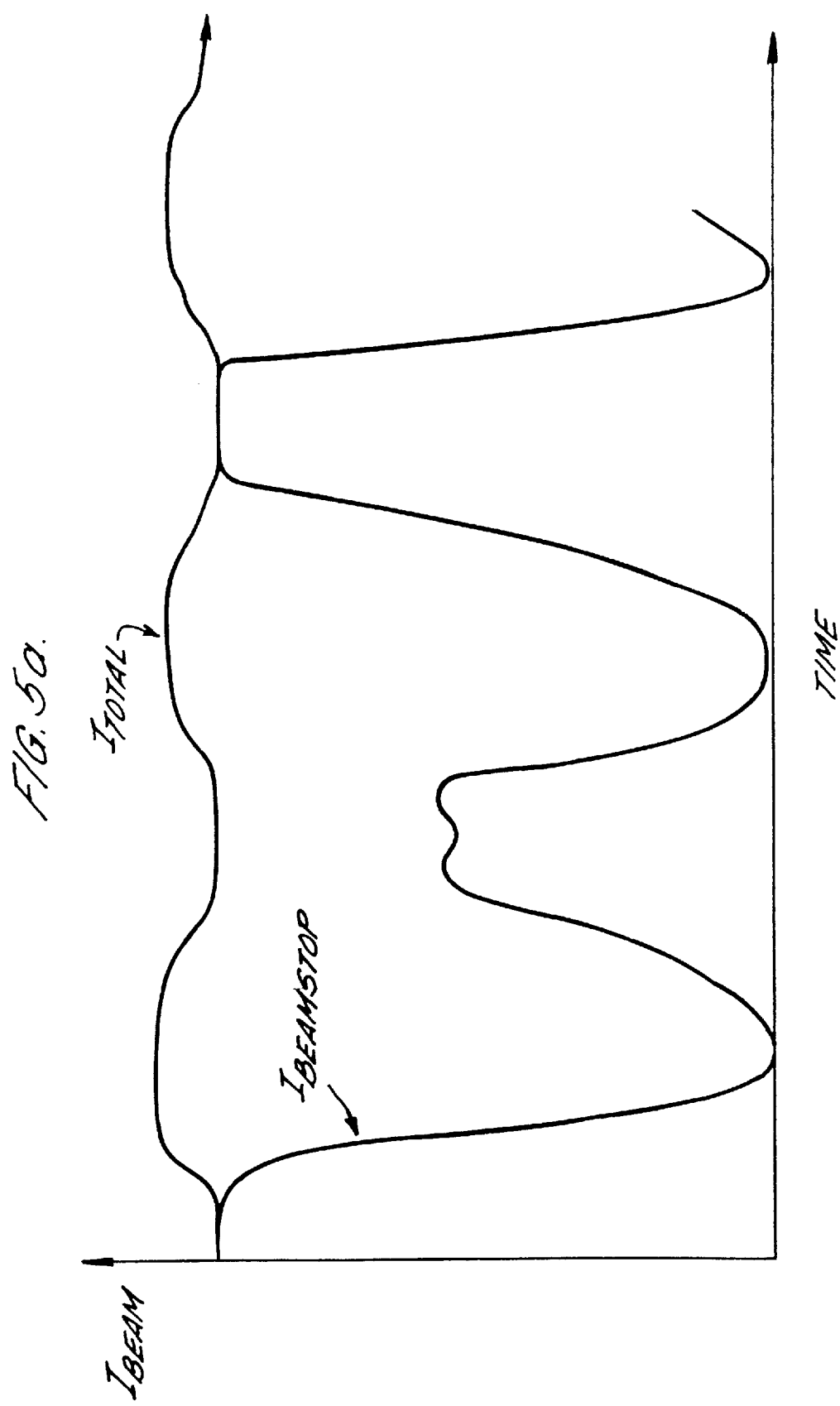

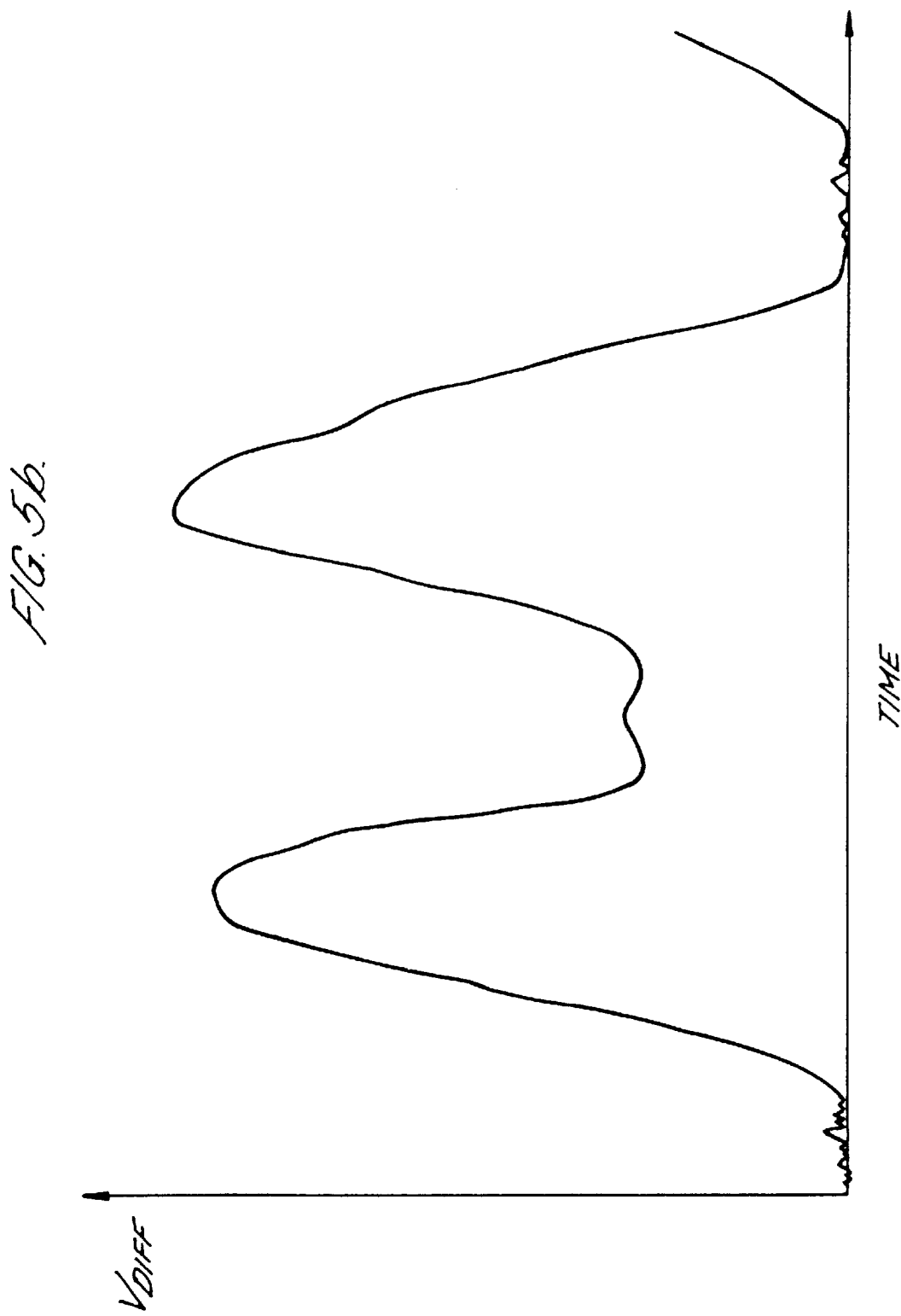

ION IMPLANTATION BEAM MONITOR

This application is the national phase under 35 U.S.C. §371 of PCT International Application No. PCT/GB99/02087 which has an International filing date of Jul. 1, 1999, which designated the United States of America.

FIELD OF THE INVENTION

This invention relates to an ion implantation beam monitor, in particular for monitoring the quality or stability of an ion beam in an ion implanter which implants ions into substrates such as semiconductor wafers.

This application claims priority under 35 U.S.C. §119 of United Kingdom Application No. 9814285.4, which has a filing date of Jul. 1, 1998, in accordance with 37 C.F.R. §1.55(1)(ii) and which was identified in accordance with the regulations under the Patent Cooperation Treaty as a priority document to PCT International Application No. PCT/GB99/02087 from which this application is derived.

BACKGROUND OF THE INVENTION

Semiconductor devices are typically formed from a semiconductor substrate material into which atoms or molecules of selected dopants have been implanted or defused. The dopant particles produce regions in the semiconductor substrate having varying conductivity. By selecting appropriate dopant materials, the majority charge carrier may be locally altered within the substrate.

One preferred technique for adding dopant materials to semiconductor substrates uses ion implantation. This technique minimises the size of the device features created by the dopants within the substrate, reducing the overall size of the semiconductor device itself and increasing operational speed.

The principles of operation of an ion implantation apparatus will be familiar to those skilled in the art. Briefly, a plasma generates positive ions of the selective dopant material in an ion source. The required positively charged ions are extracted from the ion source, which are accelerated by application of an acceleration potential through a magnetic field. The magnetic field is generated by a mass selection arrangement which bends the extracted ions around a curved path. The radius of curvature of the flight path of the ions is dependent upon the mass/charge ratio of the individual ions. The exit of the mass selection arrangement has a slit within it so that only ions having a predetermined mass/charge ratio can exit the mass selection arrangement.

Those ions exiting the mass selection arrangement impinge upon a semiconductor substrate to be doped. Typically, this substrate will have previously been patterned with photo resist so that only selected regions are doped.

The depth to which ions are implanted in the substrate will depend upon their energy when incident upon the substrate. In order to generate ions for implantation, it is standard practice to provide an arrangement to generate a desired potential difference between the "flight tube" and sample holder. The flight tube is an expression used throughout this specification and the claims to refer to the metalwork of the mass selection arrangement which is normally all at a common potential with reference to earth. However, the term "flight tube" is also applicable to any structure where corresponding electrode arrangements arise—for example a structure which itself has a potential referenced to earth and from which the potential of the ion source is in turn referenced. For example, the flight tube may contain an r.f. accelerator or booster positioned downstream of the mass selector for which the final exit electrode of the booster is at a potential referenced to the mass selection.

Usually, the target substrate is held at or near earth potential. If the flight tube is at a positive potential with respect to the sample holder/target substrate, then the ions are accelerated post mass selection. This is called "post acceleration", and is desirable when deep implantation of ions is required. On the other hand, if the flight tube is at a negative potential with respect to the sample holder, then the ions are decelerated post mass selection. This is called "post deceleration". Post deceleration is typically employed to produce very shallow structures within the surface of the substrate, to decrease the size and increase the speed of the resultant semiconductor device.

In some arrangements, it is desirable to operate the flight tube at substantially the same potential as the substrate holder, so that there is no post acceleration or deceleration. This mode of operation is termed the "drift mode".

Frequently, the cross-sectional area of the ion beam at the substrate is less than that of the substrate, in order to prevent ions in the beam from sputtering the walls of the apparatus and introducing impurities, and to increase doping uniformity. This necessitates scanning of either the substrate relative to a fixed direction ion beam or scanning the ion beam across a fixed substrate. In practice, it is preferable to scan the substrate while maintaining the ion beam in a fixed direction.

It is important when doping substrates with an ion beam from an ion implantation apparatus that the ion current striking the substrate be monitored. This is to ensure correct doping. If, for example, the ion beam contains a drop-out, then the substrate will not be doped properly. Several ways of monitoring the beam have been proposed, and a Faraday detector, such as a Faraday cup or bucket, is often employed.

In one known apparatus, the Faraday detector acts as a beam stop arranged down stream of a rotating spoked wheel. The rotating wheel carries a plurality of substrates to be doped and is scanned across an ion beam. The beam stop collects ions passing through or missing the wheel, as well as any secondary electrons generated. In another apparatus, a solid wheel is employed instead, and the Faraday detector is arranged upstream of the wheel.

Each of these ion beam monitors suffer from drawbacks, however. It is therefore an object of the present invention to provide an improved apparatus and method for monitoring the ion beam.

SUMMARY OF THE INVENTION

According to a first aspect of the present invention, there is provided an ion implantation apparatus comprising a holder for a substrate to be implanted, a source of ions to be implanted in the substrate, a flight tube through which ions from the source travel towards the holder, an ion accelerator arranged to supply an acceleration bias between the source and the flight tube such that the ions are accelerated to an acceleration energy, a power supply arranged to generate a desired potential difference between the substrate holder and flight tube, an electrically conductive return current path connected to conduct the entirety of the current returned to the flight tube such that the flight tube is maintained at a desired potential relative to the substrate holder, and a return current monitor arranged to provide a signal representative of the return current flowing through the return current path.

Measuring the total current returned to the flight tube provides a useful indication of the total ion current in the beam leaving the flight tube, as well as any electrons travelling back to, and being absorbed by, the flight tube. This in turn permits the quality of the ion beam post mass selection to be monitored, continuously if desired. Previously, for example when using a beam stop behind the substrate holder, the ion beam could only be monitored (via the beam stop current) when the ion beam was not absorbed by the substrate holder. This prevented drop-outs in the ion beam, for example due to arcing in the ion source, from being detected if these occurred whilst the substrates were absorbing the ion beam rather than the beam stop.

Preferably, the power supply generates a potential difference between the substrate holder and flight tube such that the ions are decelerated between the flight tube and the substrate holder. Although post mass selection acceleration is desirable in certain cases, it is more often preferable to decelerate the ions prior to impact with a substrate.

According to a second aspect of the present invention, there is provided an ion implantation apparatus comprising a holder for a substrate to be implanted, a source of ions to be implanted in the substrate, a flight tube through which ions from the source travel towards the holder, an ion accelerator arranged to supply an acceleration bias between the source and the flight tube such that the ions are accelerated to an acceleration energy, a low resistance, electrically conductive return current path connected to conduct the entirety of the current returned to the flight tube such that the flight tube is maintained at substantially the same potential as the substrate holder, and a return current monitor arranged to provide a signal representative of the return current flowing through the return current path.

Connecting the flight tube to the substrate holder via a low resistance path means that the ions exiting the flight tube are neither accelerated nor decelerated as they approach the substrate holder.

Preferably, the ion implantation apparatus of the first and second aspects of the present invention further comprises a beam stop arranged to absorb a portion of the ion beam not absorbed by the substrate or substrate holder, and to generate a beam stop current therefrom, the beam stop current being returned to the flight tube via the return current path. In that case, the apparatus may further comprise a comparator arranged to provide a signal representative of the difference between the return current through the return current path and the beam stop current. Thus, the beam stop current may be compared, in real time, with the total current being returned from the substrate, substrate holder and beam stop to the flight tube.

According to a third aspect of the present invention, there is provided an ion implantation apparatus comprising a holder for a substrate to be implanted, a source of ions to be implanted in the substrate, a flight tube through which ions from the source travel towards the holder, an ion accelerator arranged to supply an acceleration bias between the source and the flight tube such that the ions are accelerated to an acceleration energy, a beam stop arranged to absorb a portion of the ion beam not absorbed by the substrate or substrate holder, and to generate a beam stop current therefrom, an electrically conductive controlled current path connected to conduct the entirety of the current to the flight tube such that a desired potential difference is maintained between the substrate holder and flight tube, and a comparator arranged to provide a signal representative of the difference between the controlled current through the return current path and the beam stop current.

Comparing the beam stop current with the total current returned to the flight tube allows a cross check on beam stop accuracy to be made, when the ion beam does not impinge upon any part of the substrate holder.

The apparatus may also include scanning means for scanning the ions relative to the substrate, and optionally relative to the beam stop as well. For example, the substrate may be scanned relative to a fixed ion beam direction.

Preferably, the substrate holder comprises a plurality of substrate supports each mounted relative to a rotatable hub. The beam stop may include a Faraday-type detector.

The invention also extends to a method of implanting ions in a substrate at a desired implant energy, comprising accelerating ions to a transport energy by supplying an acceleration bias between an ion source and a flight tube through which the ions travel, transporting the ions through the flight tube to the substrate, generating a return current signal representative of the entirety of the current returned to the flight tube, the return current being controlled such that a desired potential difference is maintained between the substrate holder and flight tube, and monitoring the ions transported through the flight tube to the substrate based upon the signal representative of the return current.

Furthermore, there is provided a method of monitoring the quality of an ion beam in an ion implantation apparatus, comprising accelerating ions to a transport energy by supplying an acceleration bias between an ion source and a flight tube through which the ions travel, transporting the ions as in an ion beam through the flight tube to a substrate, generating a return current signal representative of the entirety of the current returned to the flight tube, the return current being controlled such that a desired potential difference is maintained between the substrate holder and flight tube, and monitoring the quality of the ion beam based upon the signal representative of the return current.

BRIEF DESCRIPTION OF THE INVENTION

The invention may be put into practice in a number of ways, one of which will be described by way of example only and with reference to the accompanying drawings in which:

FIG. 5 shows the output of the beam stop of FIG. 1 together with the output of the further beam current detector of FIG. 3.

DETAILED DESCRIPTION OF THE INVENTION

Figure 1A:
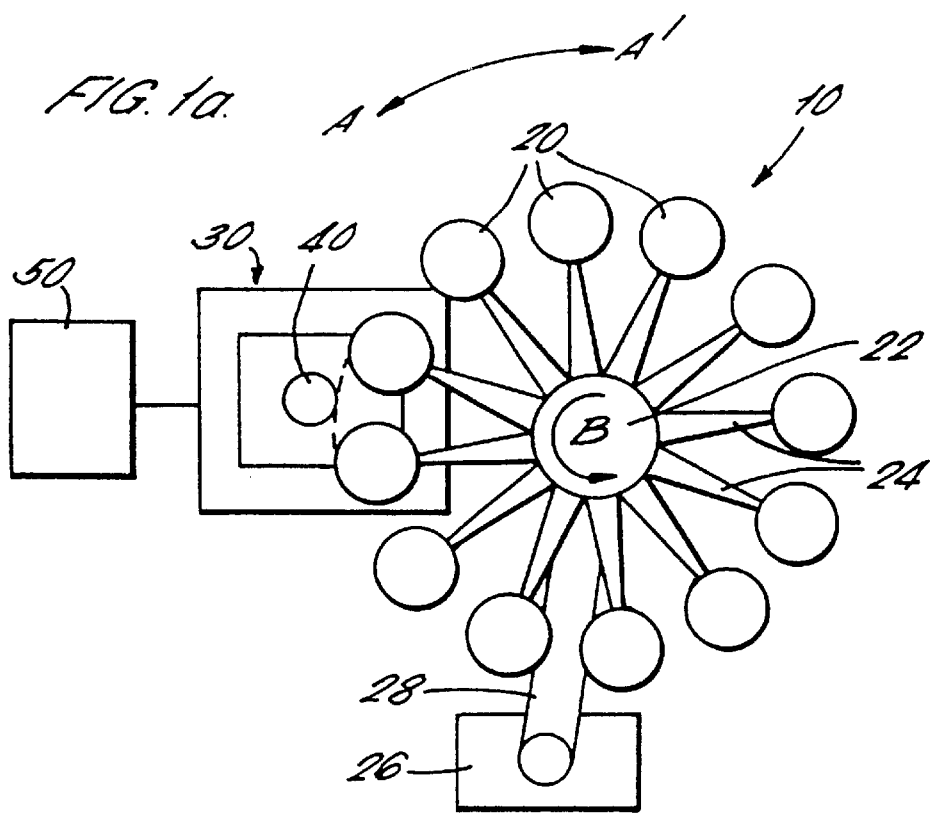
FIGS. 1a and 1b show front views of a substrate holder and beam stop.
Figure 1B:
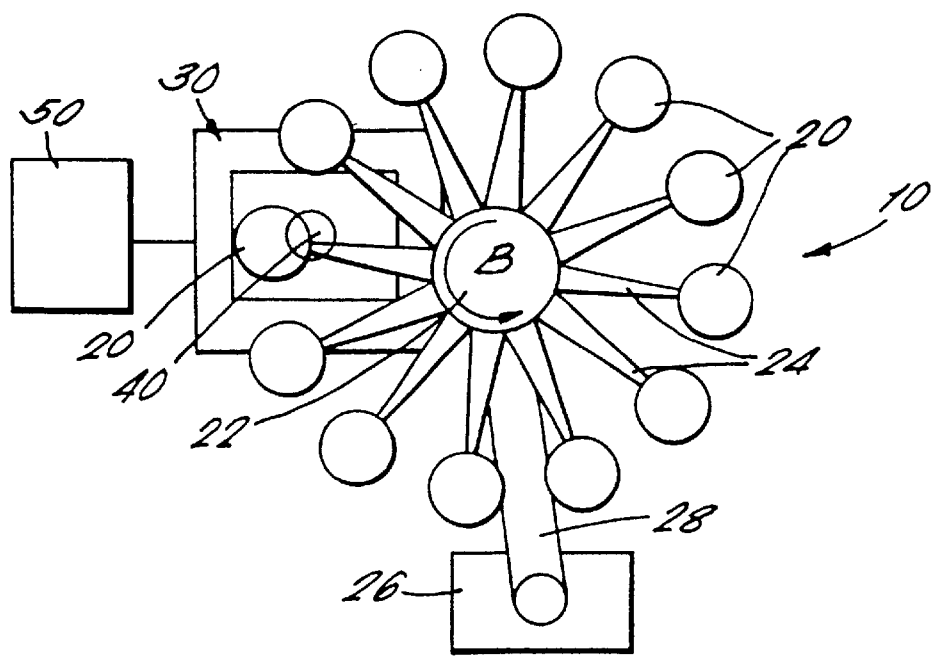

FIGS. 1a and 1b show a typical substrate holder 10 looking along the lines of ions exiting the slit in the mass selection arrangement. The substrate holder 10 is of the spoked wheel type and comprises a plurality of substrate supports 20, onto which substrates to be doped may be affixed. The substrates supports 20 are spaced equidistantly from a central hub 22 by a plurality of spokes 24. The central hub 22 is connected to a drive 26 by a shaft 28. The drive 26, which may for example be an electric motor, drives the shaft 28 such that the hub 22 is caused to move reciprocally in the manner of an inverted pendulum. Referring to FIG. 1a, this motion is indicated by the arrows AA'. In the following description, one movement of the shaft from its leftmost extension at A', to its rightmost extension A, and back to its leftmost extension A', is termed a substrate scan.

In addition to its reciprocal motion, the hub is also rotated about its axis, as indicated by the second arrow B in FIG. 1a. Thus, the ion beam, which normally follows a fixed, linear trajectory once it exits the mass selection apparatus, is caused to scan across the plurality of substrates held on the substrate supports 20 by the reciprocating and rotating movement of the substrate holder 10.

In this preferred embodiment, the ion beam is aimed at a beam stop 30 arranged downstream of the substrate holder 10, as shown in FIGS. 1a and 1b. The beam stop 30 includes a Faraday type current detector 40, connected to ancillary circuitry 50 which generates a beam stop current representative of the charge built up in the Faraday type current detector 40.

When the shaft 28 of the substrate holder is at its furthest point of travel away from the beam stop 30, as shown in FIG. 1a, the ion beam, which is directed at the Faraday type current detector 40, strikes only the current detector itself, and completely misses the rotating substrate support 20. The beam stop current is at this point similar to the actual ion beam current. However, as the shaft 28 of the substrate holder 20 moves back towards the beam stop 30, the current detector 40 becomes obscured by the plurality of rotating substrate supports as they pass in front of it. The apparent current measured by the beam stop thus reduces as the ion beam is absorbed instead by the substrates upon the substrate supports 20.

It will be understood that other substrate holder arrangements are contemplated. For example, a solid wheel (rather than a spoked wheel) may be used. Furthermore, the substrate holder may move reciprocally up and down (or side to side) in a straight line rather than in an arc as described above.

It will be understood that other substrate holder arrangements could be used.

Figure 2:
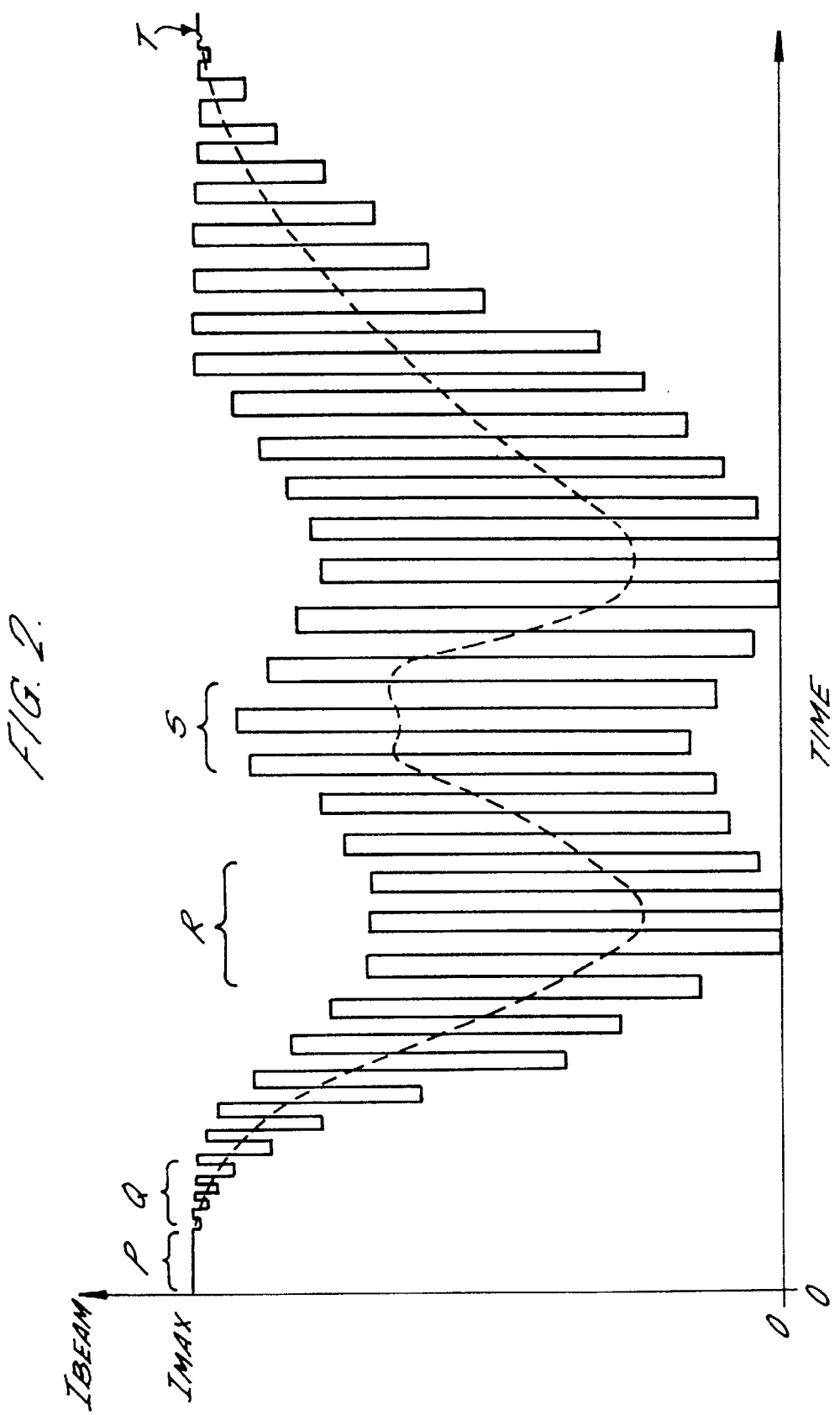
FIG. 2 shows the output of the beam stop of FIG. 1 as a function of time.

FIG. 2 shows a schematic plot of beam stop current $I_{beam}$ against time. Over the period marked P in FIG. 2, the beam-current is a maximum, and occurs when the shaft 28 of the substrate holder 10 is at its furthest point A' away from the beam stop 30. As the shaft 28 moves back towards the beam stop 30, the substrate supports 20 partially block the passage of the ion beam to the current detector 40. At this point, the ion beam is able to pass wholly through the gaps between the substrates, however, and the beam current thus becomes a series of negative pulses between $I_{beam}=I_{max}$ and $I_{beam}<I_{max}$, as shown in region Q of FIG. 2.

The shaft 28 continues to move towards the beam stop 30, and the minimum current in the current pulses reduces to zero as the ion beam is wholly absorbed by the substrates as they pass. Furthermore, the maximum current in each pulse reduces, as the height of the ion beam is greater than the spacing between substrates and a part of the ion beam is captured by the substrates at all times. This is shown in region R of FIG. 2.

As the substrate supports 20 pass to the left of the current detector 40 (when viewed along the line of the ion beam in the arrangement of FIGS. 1a and 1b) the measured current increases again. A subsidiary maximum is reached when the ion beam is partially obscured only by the spokes 24 of the substrate holder 10. This is shown at S in FIG. 2.

The shaft 28 then starts to return back towards its point of furthest travel (A') from the beam stop 30 and the current eventually reaches a primary maximum again, at T, as shown in FIG. 2. It will be appreciated that, in fact, the widths of the pulses (several milliseconds each) are several orders of magnitude less than the time for one scan cycle, and in practice only the carrier wave (indicated by a broken line in FIG. 2) is detected, rather than the modulated output of FIG. 2. This is because the current to voltage converter, explained below, includes a low pass filter in series with its output, that rolls off at 80 Hz. This filters out the pulses shown in FIG. 2, which typically have a frequency between 350 Hz and 550 Hz.

The use of a beam stop in the arrangement of FIG. 1 thus prevents accurate measurement of ion beam current, and hence meaningful ion beam stability monitoring, over most of the substrate doping operation.

Figure 3:
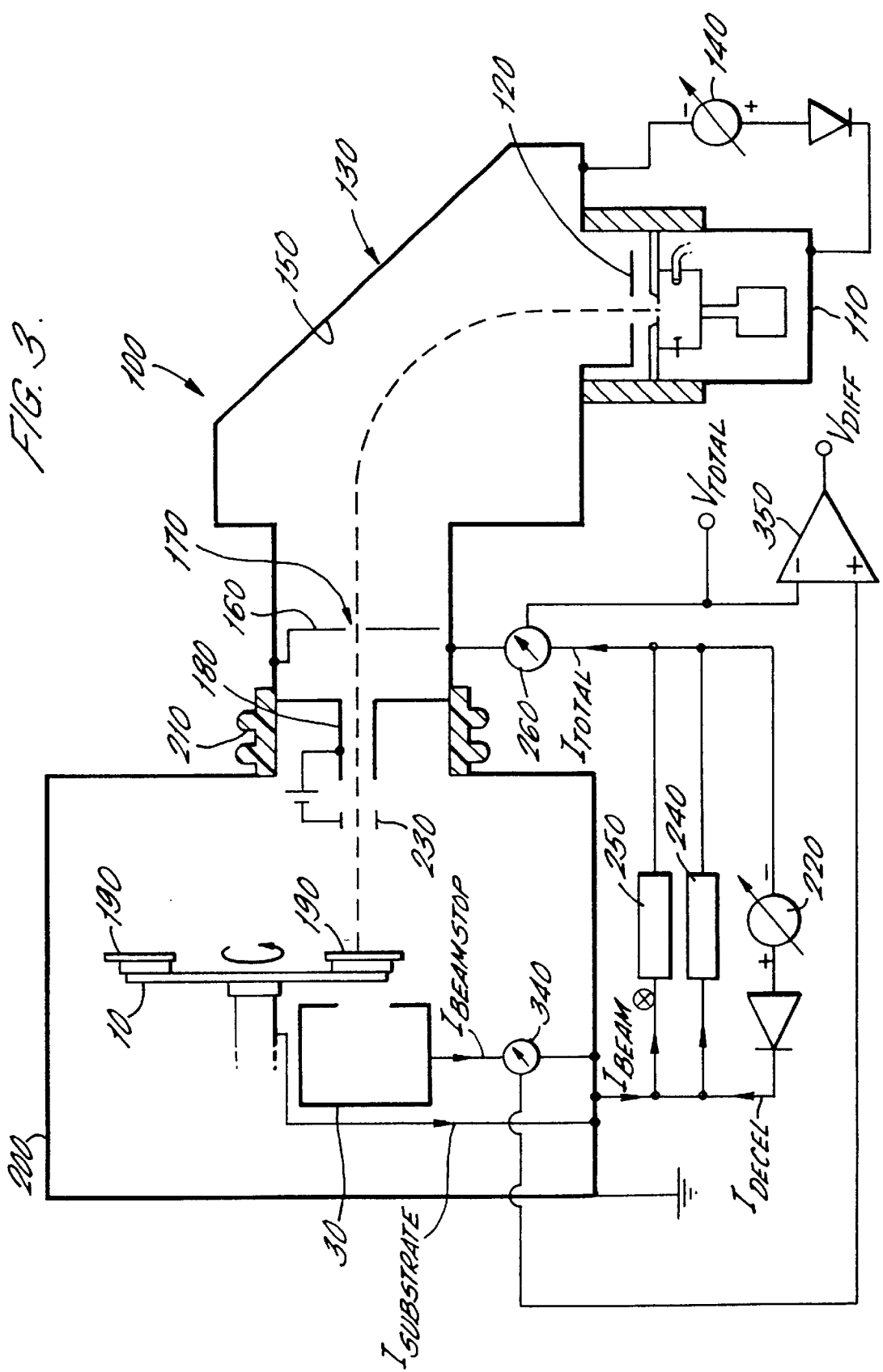
FIG. 3 shows a schematic view of an ion implantation apparatus according to a first preferred embodiment of the present invention including a first return current monitor.

Referring now to FIG. 3, an ion implantation apparatus 100 is shown. The apparatus comprises an ion beam source 110, such as a Freeman or Bernas source, which is supplied with ions of a substance which is to be implanted into a substrate. The ions are extracted from the ion source 110 by an extraction electrode assembly 120 which is in electrical contact with a flight tube 130. The flight tube 130 is electrically isolated from the ion source 110 and a high tension power supply 140 applies a potential difference between the flight tube 130 and ion source 110.

This potential difference causes positively charged ions to be ejected from the ion source 110 into the flight tube 130. The flight tube 130 includes a mass analysis arrangement comprising a mass analysing magnet 150 and a mass selection electrode 160. Upon entering the mass analysis apparatus within the flight tube 130, the electrically charged ions are deflected by the magnetic field of the mass analysis magnet 150. The radius of curvature of each ion's flight path is defined, for a constant magnetic field, by the mass/charge ratio of the individual ions.

A mass selection slit 170 is provided within the mass selection electrode 160, so that only ions having a chosen mass/charge ratio can exit the mass analysing apparatus. Those ions passing through the slit 170 enter a tube 180 which is electrically connected to, and integral with, the flight tube 130.

The mass selected ions exit the tube 180 and strike a semiconductor substrate 190, mounted upon a substrate holder 10. The substrate holder 10 holds a plurality of substrates, as has been described in relation to FIGS. 1a and 1b. Located behind (i.e, downstream of) the substrate holder 10 is a beam stop 30.

To maintain the beam current at an acceptable level, a minimum ion extraction energy of about 10 keV is employed. The ions are maintained at this energy throughout the flight tube until they emerge from the tube 180 downstream of the slit 170. It is often desirable for the energy at which the ions impact the substrate 190 to be considerably lower than the 10 keV extraction energy. For example, the energy at impact on the substrate may desirably be as low as several hundred electron volts. Thus, a reverse bias voltage must be applied between the substrate 190 and the flight tube 130. The flight tube is, of course, at a negative potential relative to the ion source 110 by virtue of the regulated high tension power supply 140.

The substrate holder 10 and beam stop 30 are contained within a housing 200 which is mounted relative to the flight tube 130 by insulating standoffs 210. Both the beam stop 30 and substrate holder 10 are connected to the flight tube 130 via a deceleration power supply. Normally, the beam stop and substrate holder are held at a common ground potential so that, in order to decelerate the positively charged ions, the deceleration power supply 220 generates a negative potential with respect to the grounded substrate holder beam stop at the flight tube 130.

In order for the deceleration power supply 220 to maintain a regulated voltage between the substrate holder/beam stop and flight tube, it is important to ensure that a forward current flows through the deceleration power supply 220. This is achieved by connecting a deceleration supply load resistance 240 in parallel with the power supply 220.

In order to provide cooling to assemblies in the beamline and ion source areas of the implanter, a closed circuit cooling water flow is required from a heat exchanger located at ground potential. The flow and return pipes must cross the post mass acceleration or deceleration voltage gaps. The wafer is slightly electrically conductive and part of the return current flow from the substrate passes through these pipes. This is a further effective load resistance in parallel with the deceleration supply 220. Although the current returned through the cooling pipes is typically negligible, the current through the water used to cool the substrate holder (which is usually deionized) will not necessarily be negligible. For example, when high post mass acceleration or deceleration voltages are employed, a cooling water current of several mA may arise. To take this into account FIG. 3 shows a cooling system resistance 250, in parallel with the deceleration supply load resistance 240 and the deceleration power supply 220.

The current flowing through the deceleration supply load resistance 240 will then be the sum of the forward current through the deceleration power supply 220 ($I_{decel}$) and the net beam current $I_{beam}$ absorbed by both the substrate 190 and beam stop 130 minus a small cooling system water current.

The output of the beam stop 30 is monitored by a first current monitor 340, which generates a voltage signal representative of the beam stop current. This voltage signal is connected to one input of a comparator 350, as will be described in more detail below.

The ion implantation apparatus 100 also contains a second current monitor 260 arranged in the path of the total current (the sum of the beam and deceleration currents) as it returns to the flight tube 130. This second current monitor 260 also generates a voltage signal $V_{TOTAL}$, which indicates the total current returning to the flight tube. In one embodiment, the signal $V_{TOTAL}$ may be measured directly without comparing it to the beam stop current.

Alternatively, the signal $V_{TOTAL}$ is fed to a second input of the comparator 350. Thus, the comparator 350 generates an output $V_{DIFF}$ representative of the difference between the beam stop current $I_{beam\ stop}$ and the total current $I_{TOTAL}$ returned to the flight tube 130.

Figure 4:
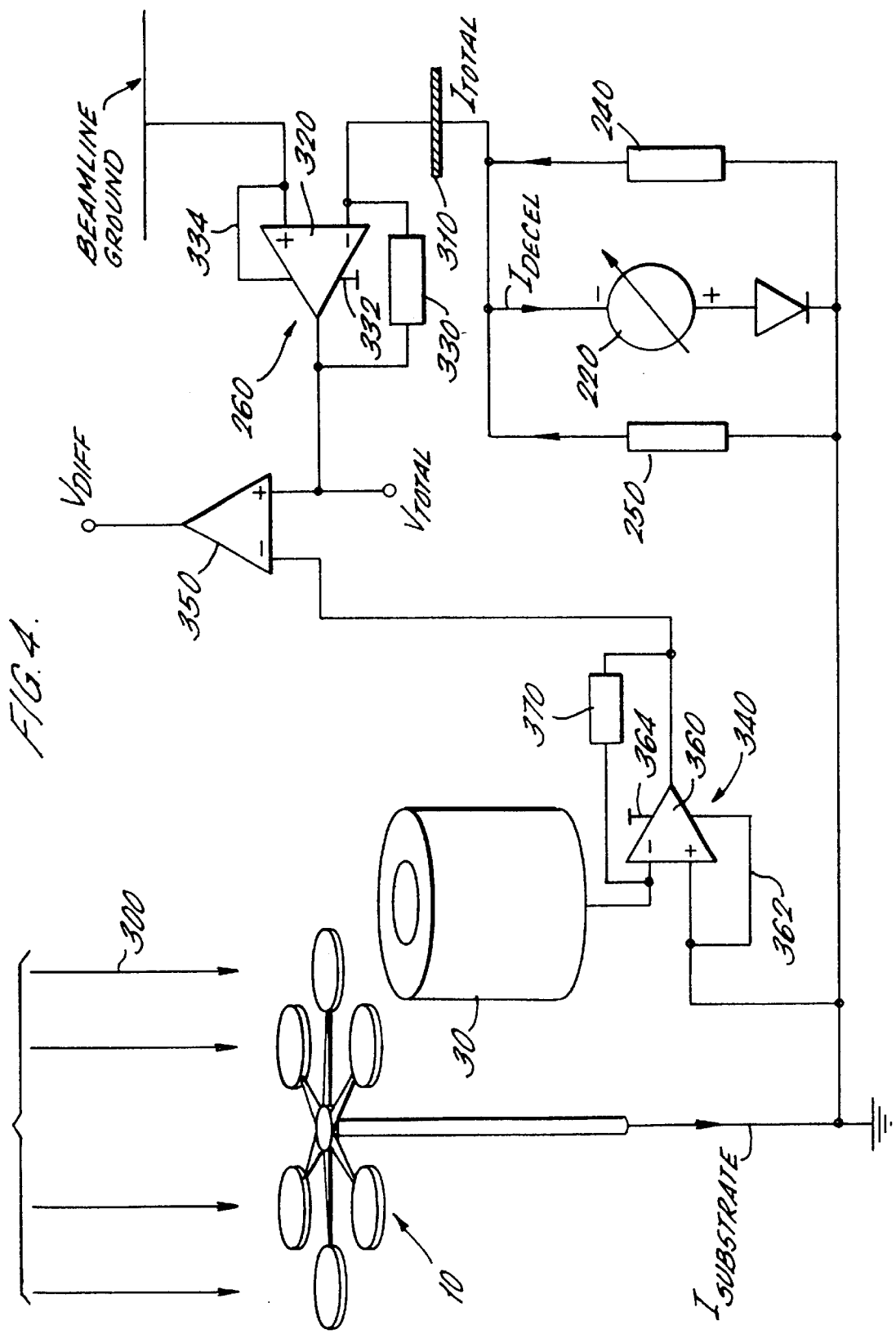
FIG. 4 shows, schematically, the current paths in the ion implantation apparatus of FIG. 3.

Referring now to FIG. 4, a schematic diagram of the current flow and the two current monitors is shown. Features common to FIGS. 3 and 4 are labelled with similar numerals.

The incident ion beam 300 impinges upon the substrate holder 10 and beam stop 30. It will be appreciated that, whilst in FIG. 4 the beam is shown scanned relative to a stationary wheel and beam stop, it is in practice preferable to scan the wheel whilst maintaining the ion beam 300 stationary and directed towards the beam stop.

The output of the beam stop 30 is connected to ground potential via a first current monitor shown generally at 340.

The first current monitor 340 includes a current-to-voltage converter employing a first operational amplifier 360. The output of the beam stop 30 is fed to the inverting input of the operational amplifier 360, the non-inverting input thereof being grounded. In parallel with the first operational amplifier 360 is a first feedback resistor 370. As the non-inverting input of the first operational amplifier 360 is at ground potential, the inverting input is at a virtual earth potential. The inputs of an operational amplifier do not draw a current, and the first current monitor 340 therefore acts as a current-to-voltage converter. The current flows through the operational amplifier from ground via power rails 362,364.

The output of the beam stop current to voltage converter is filtered by a low pass filter (not shown) to remove the relatively high frequency pulses caused by the preferred "wheel" shape of the substrate holder as it cuts the ion beam. Active or passive devices can be used to filter the signal and suitable ways of doing this will be apparent to the skilled person.

The voltage output of the first current monitor is connected to a differential amplifier 350, as previously described in connection with FIG. 3.

The total current from the substrate holder 10 and beam stop 30 passes through the parallel arrangement of the deceleration power supply 220, the deceleration supply load resistance 240, and any cooling system resistance 250. The total current $I_{TOTAL}$ is fed to a current termination plate 310 which in turn is attached to a second current monitor 260 which operates in a similar manner to the first current monitor 340. In particular, the second current monitor 260 includes a second operational amplifier 320, having in inverting input connected to the current termination plate 310. The second current monitor 260 also has a second feedback resistor 330 arranged in parallel with the second operational amplifier 320. Again, current flow through the second operational amplifier 320 is maintained through a DC supply (not shown) attached to the power rails of the second operational amplifier 332,334.

The advantages of monitoring the total current returning to the flight tube, instead of, or as well as, the current from the beam stop 30, may be seen from FIG. 5a, which shows the measured beam current as a function of time. The curve labelled $I_{beam\ stop}$ is the current measured only by the first current monitor 340 (indicative of the current from the beam stop). The curve marked $I_{TOTAL}$ is the total current returned from the beam stop 30 and substrate holder 10 to the flight tube. In other words, the curve marked $I_{TOTAL}$ should be broadly indicative of the ion beam current at the point when it impacts the substrate holder/beam stop assembly. Any arcing, for example, in the ion source will manifest itself as a drop-out in the ion beam. This in turn may be monitored by monitoring $I_{TOTAL}$. At any time during the implantation cycle, a qualitative indication of ion beam integrity may then be obtained. In particular, the voltage signal which is an output of the current monitor 260 allows wide band stability monitoring of the ion beam.

Furthermore, the problem of ripples in the current measured by the beam stop is largely avoided with the apparatus of the present invention. $I_{TOTAL}$ is slightly distorted due to back streaming electrons generated when the ion beam is striking the substrates. For positively charged ions, any electrons liberated from the substrates are accelerated away from the substrates (for ion deceleration), thus adding to the current returned to the flight tube 130. The beam stop effectively traps secondary electrons, however, and there are no back streaming electrons to augment the current when the substrate holder does not occlude the beam.

FIG. 5b shows the output of the differential amplifier 350. When the ion beam is entirely incident upon the beam stop 30, the beam stop current substantially equals the current being returned to the flight tube, i.e. $I_{BEAM\ STOP} \cong I_{TOTAL}$. Thus, the differential output of the amplifier 350 is approximately zero.

As the beam begins to impinge upon the substrates 190, the beam stop current reduces, as explained in relation to FIG. 2. The total current returned to the flight tube does, however, not reduce by the same amount, and the output of the differential amplifier 350 rises.

When the beam moves off the substrates 190, and the beam stop is only partially obscured by the substrate holder spokes 24, the beam stop current rises again and the output of the differential amplifier 350 reaches a subsidiary minimum. The output of the differential amplifier 350 reaches another maximum as the beam passes back over the substrates 190 and the beam stop current drops towards zero once more. Finally, as the ion beam coincides with the beam stop once more, the output of the differential amplifier drops to approximately zero.

Figure 6:
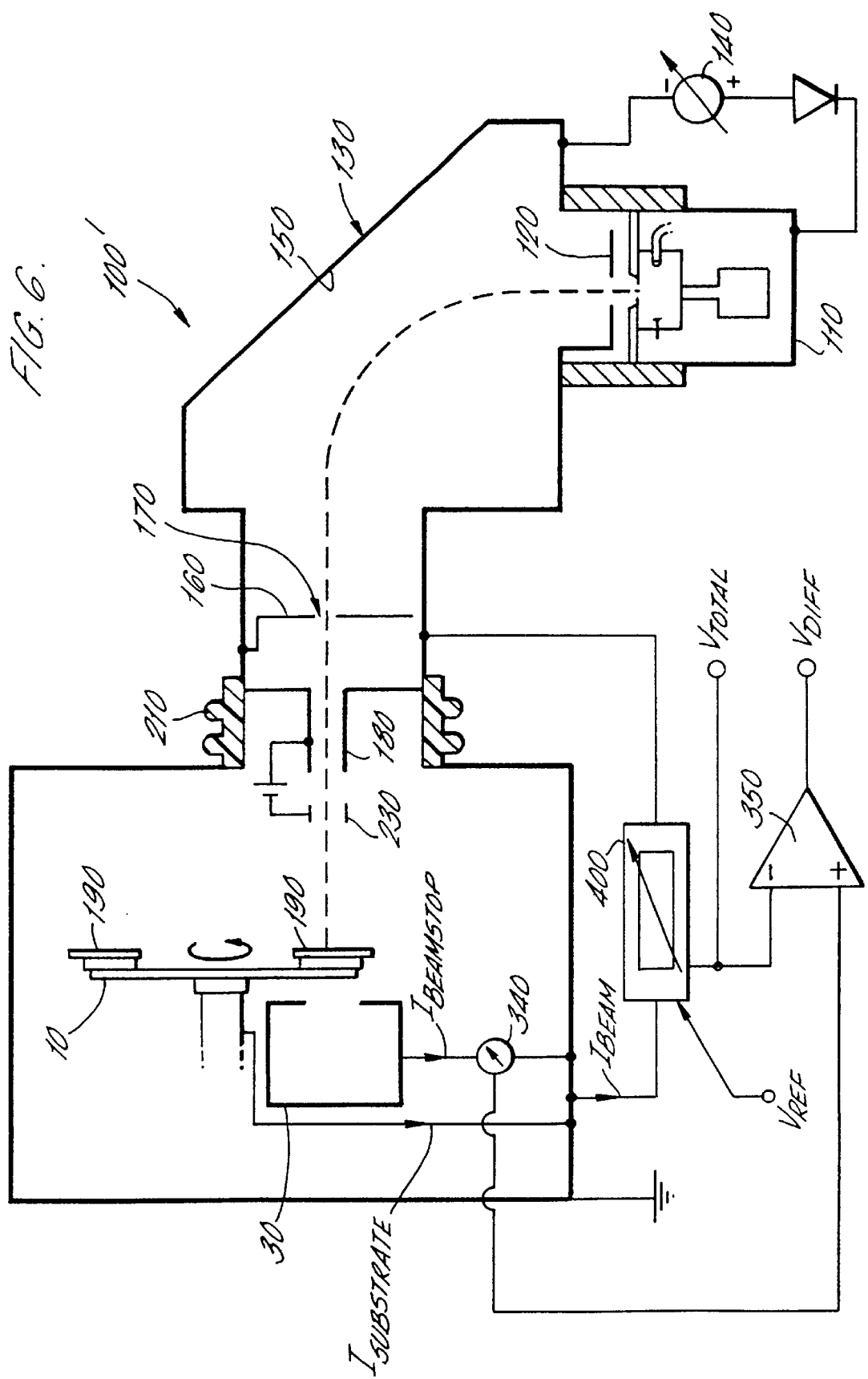
FIG. 6 shows an ion implantation apparatus according to a second preferred embodiment of the present invention including a second return current monitor.

An alternative embodiment of the present invention is shown with reference to FIG. 6. Once again, parts of the apparatus common to FIGS. 3, 4 and 6 are labelled with similar reference numerals.

As shown in FIG. 6, rather than employing a deceleration power-supply, a variable resistance 400 is placed in the current path which returns the ion beam current from the substrate holder 10 and beam stop 30 back to the flight tube 130. Although the variable resistance 400 may consist of passive devices, it is preferable to use a series of active devices, such as field effect transistors (FET's). The manner of operation of the device of FIG. 6 is described in more detail in GB 9523982.8. Briefly, the potential difference between the substrate holder/beam stop (normally held at ground potential) and the flight tube 130 is controlled by varying the resistance of a chain of FET's connected in series between the substrate holder/beam stop (at ground potential) and the flight tube. This is done by measuring the voltage across the FET chain with a potential divider, buffering it and comparing it with a reference voltage $V_{ref}$ in a differential amplifier. The error signal (i.e, the amplified difference between the desired deceleration potential and the actual deceleration potential as measured by the potential divider) adjusts the effective resistance of the FET chain.

The potential drop across the FET chain, $V_{TOTAL}$, is indicative of the total current returned to the flight tube 130. In one embodiment, this is fed to a comparator, such as a differential amplifier 350 (see FIG. 6). The other input to the differential amplifier 350 is a voltage representative of the beam stop current. This is derived from a beam stop current monitor 340. The output of the differential amplifier 350 is similar to that shown in FIG. 5b.

As with the apparatus shown in FIG. 3, the voltage signal $V_{TOTAL}$ may be measured directly, rather than being compared with the beam stop current signal.

Although a differential amplifier has been described in connection with FIGS. 3 and 6, it will be understood that a software comparison may be more suitable in some circumstances. In the case of post mass selection acceleration or deceleration (as opposed to the "drift mode"), $V_{TOTAL}$ and $V_{BEAMSTOP}$ may be separated by kilovolts and here, a software comparison would be preferred.

What is claimed is:

1. An ion implantation apparatus comprising a holder for a substrate to be implanted, a source of ions to be implanted in the substrate, a flight tube through which ions from the source travel towards the holder, an ion accelerator arranged to supply an acceleration bias between the source and the flight tube such that the ions are accelerated to an acceleration energy, a power supply arranged to generate a desired potential difference between the substrate holder and flight tube, an electrically conductive return current path connected to conduct the entirety of a return current to the flight tube which is required to maintain said desired potential difference, and a return current monitor arranged to provide a signal representative of the return current flowing through the return current path.

2. An ion implantation apparatus as claimed in claim 1, in which the power supply generates a potential difference between the substrate holder and flight tube such that the ions are decelerated between the flight tube and the substrate holder.

3. An ion implantation apparatus comprising a holder for a substrate to be implanted, a source of ions to be implanted in the substrate, a flight tube through which ions from the source travel towards the holder, an ion accelerator arranged to supply an acceleration bias between the source and the flight tube such that the ions are accelerated to an acceleration energy, a low resistance, electrically conductive return current path connected to conduct the entirety of a return current to the flight tube which is required to maintain the flight tube at substantially the same potential as the substrate holder, and a return current monitor arranged to provide a signal representative of the return current flowing through the return current path.

4. An ion implantation apparatus as claimed in claim 1 further comprising a beam stop arranged to absorb a portion of the ion beam not absorbed by the substrate or substrate holder, and to generate a beam stop current therefrom, the beam stop current being returned to the flight tube via the return current path.

5. An ion implantation apparatus as claimed in claim 4, further comprising a comparator arranged to provide a signal representative of the difference between the return current through the return current path and the beam stop current.

6. An apparatus claimed in claim 1, further comprising scanning means for scanning the ions relative to the substrate.

7. An apparatus as claimed in claim 6, in which the scanning means is arranged to scan both the substrate and the beam stop with the ions.

8. An apparatus claimed in claim 6, in which the scanning means scans the substrate relative to a fixed ion beam direction.

9. An apparatus as claimed in claim 1, in which the substrate holder comprises a plurality of substrate supports each mounted relative to a rotatable hub.

10. An apparatus as claimed in claim 1, in which the beam stop includes a Faraday-type detector.

11. An apparatus as claimed in claim 1, in which the flight tube includes mass selection means arranged to select only a proportion of the accelerated ions to be implanted into the substrate based upon the mass and charge of the said accelerated ions.

12. An ion implantation apparatus comprising a holder for a substrate to be implanted, a source of ions to be implanted in the substrate, a flight tube through which ions from the source travel towards the holder, an ion accelerator arranged to supply an acceleration bias between the source and the flight tube such that the ions are accelerated to an acceleration energy, a beam stop arranged to absorb a portion of the ion beam not absorbed by the substrate or substrate holder, and to generate a beam stop current therefrom, an electrically conductive controlled return current path connected to conduct the entirety of a return current to the flight tube which is required to maintain a desired potential difference between the substrate holder and the flight tube, and a comparator arranged to provide a signal representative of the difference between the controlled current through the return current path and the beam stop current.

13. An apparatus claimed in claim 12, further comprising scanning means for scanning the ions relative to the substrate.

14. An apparatus as claimed in claim 13, in which the scanning means is arranged to scan both the substrate and the beam stop with the ions.

15. An apparatus claimed in claim 13, in which the scanning means scans the substrate relative to a fixed ion beam direction.

16. An apparatus as claimed in claim 12, in which the substrate holder comprises a plurality of substrate supports each mounted relative to a rotatable hub.

17. An apparatus as claimed in claim 12, in which the beam stop includes a Faraday-type detector.

18. An apparatus as claimed in claim 12, in which the flight tube includes mass selection means arranged to select only a proportion of the accelerated ions to be implanted into the substrate based upon the mass and charge of the said accelerated ions.

19. A method of implanting ions in a substrate at a desired implant energy, comprising accelerating ions to a transport energy by supplying an acceleration bias between an ion source and a flight tube through which the ions travel, transporting the ions through the flight tube to the substrate, generating a return current signal representative of the entirety of the current returned to the flight tube, the return current being controlled such that a desired potential difference is maintained between the substrate holder and flight tube, and monitoring the ions transported through the flight tube to the substrate based upon the signal representative of the return current.

20. A method as claimed in claim 19, further comprising absorbing in a beam stop a portion of the ion beam not absorbed by the substrate or substrate holder, and generating a beam stop current signal representative of that portion of the ion beam not absorbed by the substrate.

21. A method as claimed in claim 20, further comprising comparing the beam stop current signal with the return current signal.

22. A method as claimed in claim 19, further comprising scanning the ion beam relative to the substrate.

23. A method of monitoring the quality of an ion beam in an ion implantation apparatus, comprising accelerating ions to a transport energy by supplying an acceleration bias between an ion source and a flight tube through which the ions travel, transporting the ions as in an ion beam through the flight tube to a substrate, generating a return current signal representative of the entirety of the current returned to the flight tube, the return current being controlled such that a desired potential difference is maintained between the substrate holder and flight tube, and monitoring the quality of the ion beam based upon the signal representative of the return current.

24. A method as claimed in claim 23, further comprising selecting only a proportion of the accelerated ions to be transported to the substrate based upon the mass and charge of the said accelerated ions.

25. A method as claimed in claim 23, in which the quality of the ion beam is monitored only after the proportion of the accelerated ions to be transported has been selected.

* * * * *

UNITED STATES PATENT AND TRADEMARK OFFICE
CERTIFICATE OF CORRECTION

| | |
|---|---|
| PATENT NO. | : 6,608,316 B1 |
| APPLICATION NO. | : 09/720777 |
| DATED | : August 19, 2003 |
| INVENTOR(S) | : Bernard Francis Harrison |

It is certified that error appears in the above-identified patent and that said Letters Patent is hereby corrected as shown below:

On Title Page, Item (30)
The following information was omitted, please add to the first page of the patent:

--Foreign Application Priority Data

July 1, 1998 United Kingdom 9814285.4--

Signed and Sealed this

First Day of May, 2007

JON W. DUDAS
*Director of the United States Patent and Trademark Office*